United States Patent [19]

Bierhoff et al.

[11] Patent Number: 5,099,126
[45] Date of Patent: Mar. 24, 1992

[54] PHOTOSENSITIVE SEMICONDUCTOR DEVICE HAVING RADIATION SENSITIVE DIODES AND PHOTOCURRENT AMPLIFICATION

[75] Inventors: Martinus P. M. Bierhoff; Job F. P. Van Mil, both of Eindhoven, Netherlands

[73] Assignee: U.S. Philips Corp., New York, N.Y.

[21] Appl. No.: 525,284

[22] Filed: May 17, 1990

[30] Foreign Application Priority Data

Jun. 2, 1989 [NL] Netherlands ............... 8901401

[51] Int. Cl.[5] ............................................ H01L 27/14
[52] U.S. Cl. ....................... 250/370.1; 250/370.01; 250/208.2; 357/30
[58] Field of Search ............ 369/47.11; 357/30 G, 357/30 D, 30 P, 30 R; 250/208.1, 208.2, 370.14, 370.01, 370.10

[56] References Cited

U.S. PATENT DOCUMENTS

| | | | |
|---|---|---|---|
| 4,433,920 | 2/1984 | Sekiya et al. | 368/201 |
| 4,549,088 | 10/1985 | Ozawa | 250/578 |
| 4,945,529 | 7/1990 | Ono et al. | 369/109 |

FOREIGN PATENT DOCUMENTS

0072488  6/1978  Japan ................. 357/30 G

Primary Examiner—Carolyn E. Fields
Assistant Examiner—James E. Beyer
Attorney, Agent, or Firm—Steven R. Biren

[57] ABSTRACT

A radiation-sensitive semiconductor device, more particularly but not exclusively a photo detection arrangement for determining the postion of a luminous spot, including a semiconductor body having at least two radiation-sensitive diodes and amplifying circuitry for the photocurrent generated by the luminous spot. The amplifying circuitry includes transistors arranged outside the area of the semiconductor body occupied by the radiation-sensitive diodes. Each transistor is assigned to and connected to a radiation-sensitive diode, while at least the active parts of the transistors are arranged more closely to each other in the semiconductor body than the diodes to which they are assigned. A focusing arrangement may advantageously incorporate such as semiconductor photodetector.

5 Claims, 2 Drawing Sheets

PHOTOSENSITIVE SEMICONDUCTOR DEVICE HAVING RADIATION SENSITIVE DIODES AND PHOTOCURRENT AMPLIFICATION

BACKGROUND OF THE INVENTION

The invention relates to a radiation-sensitive semiconductor device having a semiconductor body comprising at least two radiation-sensitive diodes, on which a luminous spot can be imaged, and means for intensifying the photocurrent generated by the luminous spot.

The invention further relates to a focusing arrangement comprising such a photosensitive device.

A photosensitive semiconductor device of the kind mentioned is described in German Offenlegungsschrift DE-A 3706252.

Such devices are used in many fields and in different ways. More particularly they are used in the field of reading and writing optical information, such as in DOR ("Direct Optical Recording"), VLP ("Video Long-Play") and CD ("Compact Disk") apparatuses and for detecting excursions in radial and axial direction of the information-carrying medium, in this case the DOR, VLP or CD record.

In an application of the said type, the radiation-sensitive semiconductor device forms part, for example, of a Foucault focusing system, as described inter alia in "Philips Technical Review, Vol. 40, 1981/82, No. 9, pp. 266-272. In this case, the radiation beam of a laser focused on the CD or video record and reflected by the record is deflected by a semi-transparent mirror surface and is split up by wedge-shaped prisms into two beams, which are each imaged as a luminous spot on two photodiodes of a photodetector provided on a semiconductor wafer mutually separated by a narrow strip.

By means of a circuit, a tracking error signal is derived from the signal difference of the photodiodes, which signal is used as control signal for stabilizing the position of the focused laser beam with respect to the record. At the same time, a second tracking error signal can be derived from the signals generated by the photodiodes, which signal takes into account and ageing or dirtying of the optical system. In the said article in "Philips Technical Review", this is extensively explained so that reference may be made to this publication for further details.

Since the information on the record has the form of pits and non-pits having dimensions of 1 μm or smaller, the device must be able to follow variations of high frequency in the detected luminous intensity. Moreover, the generated photocurrents must have a sufficiently high signal-to-noise ratio and must therefore not be too weak.

In general, photodiodes will be sufficiently rapid. The photocurrents supplied by the diodes are in most cases too weak, however, and must therefore be amplified with the aid of the aforementioned (switching) means.

The said means can be constituted in a simple manner by transistors. For this purpose, an emitter zone can be provided in the photodiodes so that the latter change into phototransistors, which supply an amplified signal, which has the desired signal-to-noise ratio.

A great disadvantage of this solution is that the transistors are then located at a comparatively large relative distance. As a result, because of the inevitable inhomogeneities of the semiconductor material it is difficult to make the transistor properties equal within the relevant tolerances.

SUMMARY OF THE INVENTION

The invention has inter alia for its object to eliminate the aforementioned disadvantages or at least to reduce them to a considerable extent.

According to the invention, a radiation-sensitive semiconductor device of the kind described above is characterized in that the said means comprise transistors, which are provided outside the area occupied by the photodiodes in the semiconductor body, each transistor being assigned to and connected to a radiation-sensitive diode and at least the active parts of the transistors being arranged more closely to each other in the semiconductor body than the radiation-sensitive diodes to which they are assigned. Preferably, the transistors are arranged as closely to each other as possible. The term "arranged as closely to each other as possible" is to be understood herein to mean a concentration of the active parts of the transistors on a surface as small as possible, taking into account the tolerances to be maintained when determining the dimensions.

It should further be noted that in this Application the terms "photo" and "light" also include the infrared and ultraviolet electromagnetic radiation invisible to the eye.

When the transistors are concentrated on a surface as small as possible, the differences in the transistor properties due to inhomogeneities, irrespective of the distance between the radiation-sensitive diodes, are reduced to a minimum.

Although a larger surface area is required for providing the transistors outside the radiation-sensitive diodes, this additional surface area is so small in a device according to the invention that this practically does not involve disadvantages.

According to a first preferred embodiment the radiation-sensitive diodes are arranged in a row and the transistors are arranged in a row substantially parallel thereto.

An important preferred embodiment used frequently in focusing arrangements is characterized in that the device comprises four photodiodes arranged in quadrants and four transistors.

The invention further relates to a focusing arrangement comprising means for projecting a light beam onto a surface, means for deflecting a part of the light beam and means for splitting up the deflected beam into at least two beams, which project luminous spots onto a photodetector, which generates signals for stabilizing the position of the said light beam with respect to the said surface, characterized in that as photodetector a radiation-sensitive semiconductor device according to the invention of the kind described above is used.

BRIEF DESCRIPTION OF THE DRAWING

The invention will now be described more fully with reference to an embodiment and the drawing, in which.

The figures are schematic and not drawn to scale, while corresponding parts are generally designated by the same reference numerals.

DESCRIPTION OF THE PREFERRED EMBODIMENTS

Figure 1:
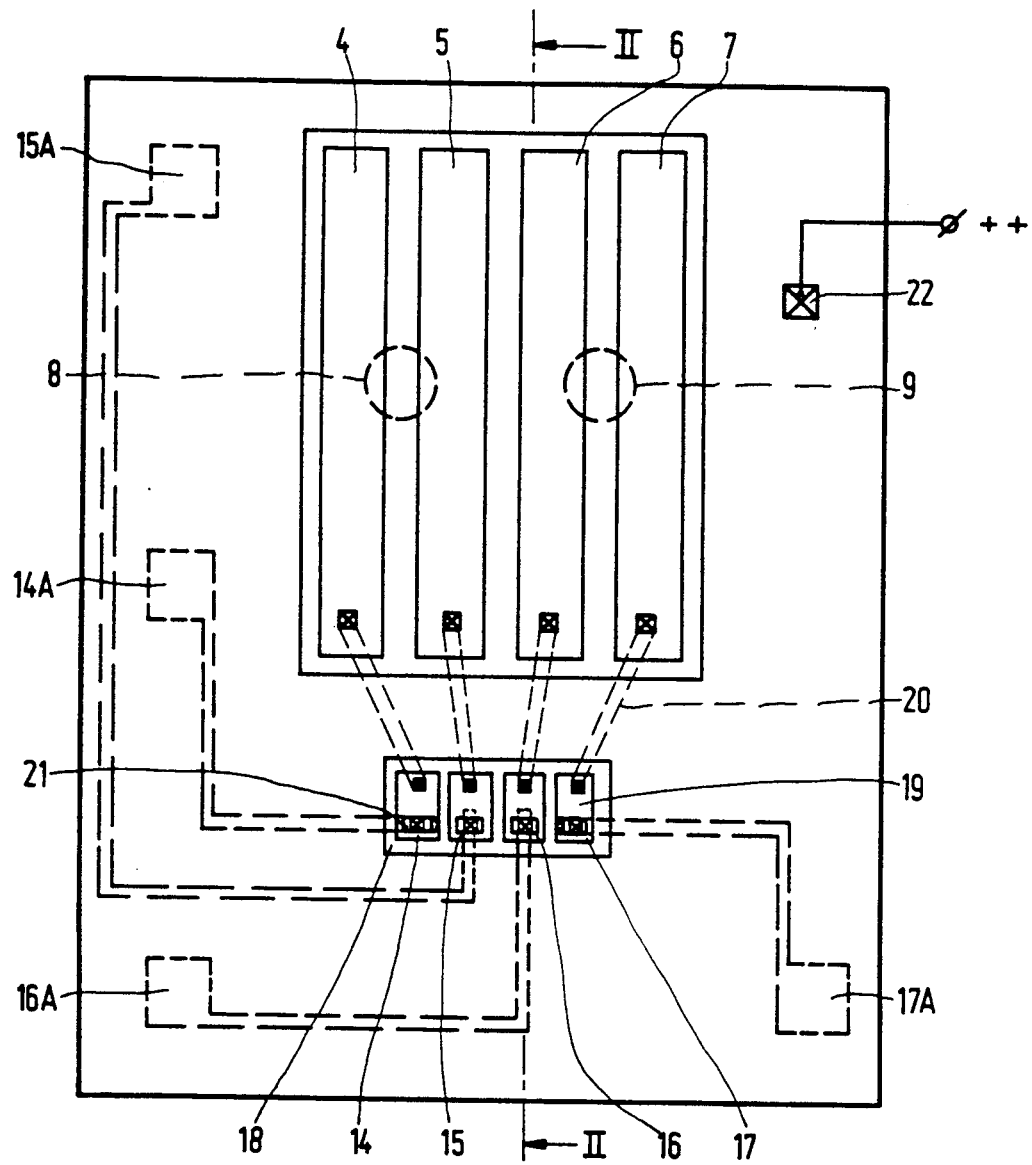
FIG. 1 shows diagrammatically in plan view a photosensitive semiconductor device according to the invention.
Figure 2:
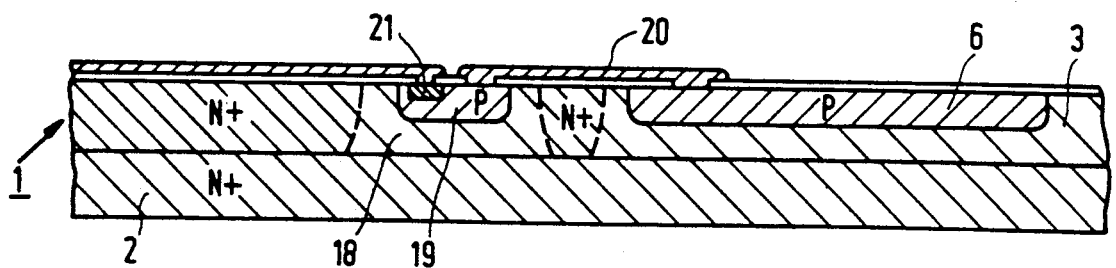
FIG. 2 shows diagrammatically a cross-section of FIG. 1 taken on the line II—II.

FIG. 1 shows diagrammatically in plan view a photosensitive semiconductor device according to the invention. FIG. 2 shows diagrammatically a cross-section of this device taken on the line II—II of FIG. 1.

The device comprises a semiconductor body 1, typically of silicon, although in certain cases other semiconductor materials may also be used. The semiconductor body, in this embodiment a silicon wafer having a highly doped n+ substrate 2 and an n− epitaxial layer 3 more weakly doped and disposed thereon comprises at least two, and in this embodiment four, photodiodes 4 to 7, on which a luminous spot can be imaged. The photodiodes each consist of a p-type zone, for example the zone 6 in FIG. 2, which zones form a pn junction with the adjoining n-type semiconductor material. In this embodiment, two luminous spots 8 and 9 originating from a Foucault focusing arrangement are projected, i.e. the luminous spot 8 onto the diodes 4 and 5 and the luminous spot 9 onto the diodes 6 and 7. The device further comprises means for amplifying the photocurrent generated by the luminous spot or spots. By means of a further circuit (not shown here), which may also be incorporated, if desired, entirely or in part into the semiconductor body 1, a tracking error signal is then derived from the analysis of the ratio of the signals originating from the diodes 4, 5, 6 and 7, as described in the aforementioned article in "Philips Technical Review".

According to the invention, the said means for amplifying the photocurrents comprise transistors 14, 15, 16 and 17 provided outside the area of the semiconductor body occupied by the photodiodes 4 to 7, each transistor being assigned to and connected to a photodiode and the active parts of the transistors 14 to 17 being arranged more closely to each other in the semiconductor body than the diodes 4, 5, 6, 7. In this embodiment, the transistors 14, 15, 16, 17 are arranged as closely to each other as possible.

The transistors 14 to 17 are provided in a common n-type island 18 constituting the common collector zone so as to be separated from the photodiodes and the relative distance of their base zones 19 is in this embodiment 10 μm. The active part of the transistors, that is to say the surface area occupied by their base zones, is therefore concentrated on a very small and consequently substantially homogeneous region of the silicon wafer. Therefore, since their dimensions are equal, they have substantially the same electrical properties, while the additional surface area occupied by them is negligibly small.

The base zone 19 of each of the transistors 14, 15, 16, 17 is connected to one of the photodiodes 4 to 7 by means of a metal track 20; metal tracks are indicated in FIG. 1 by dotted lines, the contact windows being indicated by diagonal lines. The p-type zones 6 of the photodiodes are provided, for example, by diffusion or ion implantation. The n-type emitter zones 21 of the transistors are connected through metal tracks to contact surfaces 14A to 17A, to which the further peripheral equipment required for control can be connected. These further parts of the circuit may also be provided, if desired, within the semiconductor wafer 1. The substrate is connected via the contact window 22 to a reference potential, in this case to the highest supply voltage.

In the embodiment of FIGS. 1 and 2, the photodiodes 4 to 7 are arranged in a row and the transistors 14 to 17 are arranged in a row substantially parallel thereto. This is often practical, but not necessary, and other configurations may also be used, if desired.

In the embodiment described, four photodiodes 4 to 7 are used, which subdivide the device into four quadrants. Depending upon the application, however, it is also possible to use a different number of photodiodes (at least two). The photodiodes may also be each subdivided, if desired, into two or more parallel-connected subdiodes.

Figure 3:
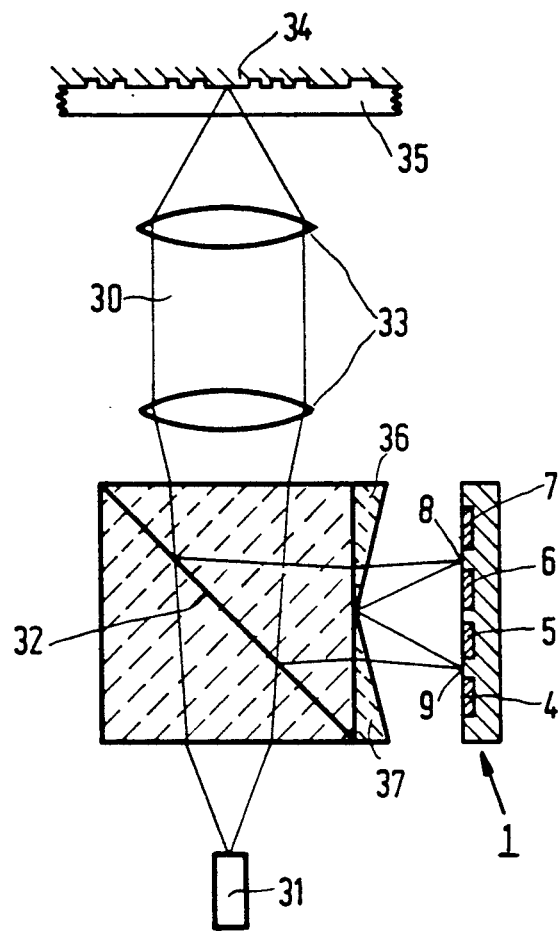
FIG. 3 shows diagrammatically a focusing arrangement according to the invention.

Finally, FIG. 3 shows diagrammatically a focusing arrangement according to the invention, which comprises as a photodetector a semiconductor circuit of the kind described with reference to one of the preceding embodiments. A radiation beam 30 originating from a laser 31 having a wavelength of, for example, 800 nm is imaged via a semitransparent mirror surface 32, which is constituted, for example, by the separation surface of a prism combination and a lens system 33, as a luminous spot 34 on a CD or VLP record 35. A part of the radiation reflected by the record 35 is deflected by the mirror surface 32 via two wedge-shaped prisms 36, 37 and is projected as two luminous spots (8, 9, see also FIG. 1) onto the photodiodes 4 to 7 of a photodetector of the kind described with reference to FIGS. 1 and 2. By means of the signals originating from the photodiodes, deviations of the luminous spot 34 with respect to its correct position caused by the excursions of the record 35 can be corrected.

It will be appreciated that the invention is not limited to the embodiments described, but that many variations are possible within the scope of the invention. For example, the conductivity types of the various semiconductor regions may all be replaced (simultaneously) by the opposite types while correspondingly reversing the polarities of the voltages. Further, semiconductor materials other than silicon may be used, while other wavelengths also may be used. The invention may further also be used for other than the focusing and positioning purposes described here.

We claim:

1. A radiation-sensitive semiconductor device having a semiconductor body comprising at least two radiation-sensitive diodes, on which a luminous spot can be imaged, and means for amplifying the photocurrent generated by the luminous spot, characterized in that said means comprises transistors, which are arranged outside the area of the semiconductor body occupied by the radiation-sensitive diodes, each transistor being coupled to a radiation-sensitive diode and at least the active parts of the transistors being arranged more closely to each other in the semiconductor body than are the radiation-sensitive diodes to which they are coupled.

2. A radiation-sensitive semiconductor device as claimed in claim 1, characterized in that the transistors are arranged as closely as possible to each other in the semiconductor body.

3. A radiation-sensitive semiconductor device as claimed in claim 1 or 2, characterized in that the radiation-sensitive diodes are arranged in a row and in that the transistors are arranged in a row substantially parallel thereto.

4. A radiation-sensitive semiconductor device as claimed in claim 1 or 2, characterized in that the device comprises four radiation-sensitive diodes arranged in quadrants and four transistors.

5. A radiation-sensitive semiconductor device having a semiconductor body comprising at least two radiation-sensitive diodes, on which a luminous spot can be imaged, and means for amplifying the photocurrent generated by the luminous spot, characterized in that said means comprises transistors, which are arranged outside the area of the semiconductor body occupied by the radiation-sensitive diodes, each transistor being coupled to a radiation-sensitive diode and at least the active parts of the transistors being arranged more closely to each other in the semiconductor body than are the radiation-sensitive diodes to which they are coupled, and a focusing arrangement comprising means for projecting a light beam onto a surface, means for deflecting a part of the light beam and means for splitting up the deflected beam into at least two beams, which project luminous spots onto said radiation-sensitive semiconductor device, which generates signals for stabilizing the position of the said light beam with respect to the said surface.

* * * * *